(12) United States Patent
Sontag

(10) Patent No.: US 8,182,710 B2
(45) Date of Patent: May 22, 2012

(54) STRUCTURING METHOD

(75) Inventor: Detlef Sontag, Freiberg (DE)

(73) Assignee: Deutsche Cell GmbH, Freiberg/Sachsen (DE)

( * ) Notice: Subject to any disclaimer, the term of this patent is extended or adjusted under 35 U.S.C. 154(b) by 747 days.

(21) Appl. No.: 12/272,749

(22) Filed: Nov. 17, 2008

(65) Prior Publication Data

US 2009/0127228 A1 May 21, 2009

(30) Foreign Application Priority Data

Nov. 15, 2007 (DE) .......................... 10 2007 054 484

(51) Int. Cl.
*C25F 3/00* (2006.01)
(52) U.S. Cl. .............. 216/99; 216/13; 216/83; 216/106; 438/753; 438/299; 438/398; 438/542
(58) Field of Classification Search .................... 216/99, 216/13, 83, 106; 438/753, 299, 398, 542
See application file for complete search history.

(56) References Cited

U.S. PATENT DOCUMENTS

| | | | |
|---|---|---|---|
| 3,971,683 A | 7/1976 | Briska et al. | |
| 4,114,254 A * | 9/1978 | Aoki et al. | ..................... 438/299 |
| 5,340,437 A | 8/1994 | Erk et al. | |
| 2002/0066935 A1* | 6/2002 | Shimizu et al. | ............... 257/412 |
| 2009/0071540 A1* | 3/2009 | Klein et al. | ..................... 136/261 |

FOREIGN PATENT DOCUMENTS

| | | |
|---|---|---|
| DE | 1040135 A | 10/1958 |
| DE | 2425684 A | 12/1975 |
| DE | 3728693 A1 | 3/1989 |
| DE | 19746706 A1 | 11/1998 |
| DE | 19962136 A1 | 6/2001 |
| WO | WO 03034504 * | 4/2003 |

* cited by examiner

*Primary Examiner* — Nadine G Norton
*Assistant Examiner* — Mahmoud Dahimene
(74) *Attorney, Agent, or Firm* — Browdy and Neimark, PLLC

(57) ABSTRACT

A method of structuring multicrystalline silicon surfaces comprises the provision of a texturing solution, the application of the texturing solution to a surface of a semiconductor substrate to be structured and the heating of the texturing solution to a texturing temperature, wherein the texturing solution comprises at least a portion of phosphoric acid.

10 Claims, No Drawings

STRUCTURING METHOD

BACKGROUND OF THE INVENTION

1. Field of the Invention

The invention relates to a method of structuring multicrystalline silicon surfaces.

2. Background Art

Due to the different crystal orientations of multicrystalline silicon surfaces, a wet chemical surface structuring thereof using alkaline substances is impossible. The wet chemical surface texturing of multicrystalline silicon is therefore generally performed using an acidic texturing solution. The acidic texturing solution usually requires an addition of hydrofluoric acid although hydrofluoric acid on its own does not have a texturing effect on silicon surfaces. Texturing of multicrystalline silicon surfaces can thus only be performed by means of acid mixtures. Compared to pure acids, an environmentally friendly disposal of such mixtures is very complicated and expensive. Furthermore, the use of hydrofluoric acid requires extensive safety precautions because of its high toxicity, which leads to even higher costs. Finally, the use of the above-mentioned acid mixtures produces highly toxic gases. The temperature of the acid mixtures usually needs to be reduced to between 8° C. and 10° C., which results in additional energy costs. Another drawback of the use of acid mixtures is their low process stability. The concentration ratio needs to be strictly adhered to in order to guarantee a constant structuring quality but as the acid mixture ratio continuously changes in the texturing process, the bath composition needs to be monitored and adapted continuously.

SUMMARY OF THE INVENTION

It is the object of the invention to create a method of structuring multicrystalline silicon surfaces which is able to overcome the prior-art drawbacks.

This object is achieved by a method of structuring multicrystalline silicon surfaces, the method comprising the following steps:

providing a texturing solution;
applying the texturing solution to a surface of a semiconductor substrate to be structured;
heating the texturing solution to a texturing temperature, wherein the texturing solution comprises at least a portion of phosphoric acid.

The gist of the invention is to use a texturing solution in the structuring of multicrystalline silicon surfaces which texturing solution comprises a portion of phosphoric acid. Surprisingly it has been found that even pure phosphoric acid which, in the form of orthophosphoric acid, initially forms pyrophosphoric acid under the influence of heat before transmuting into metaphosphoric acid when even more heat is applied, has a texturing effect on silicon even at a minimum temperature.

Additional features and details of the invention will become apparent from the description of an embodiment.

DESCRIPTION OF THE PREFERRED EMBODIMENT

The method according to the invention starts with the provision of a texturing solution. The texturing solution comprises at least a portion of phosphoric acid. The texturing solution used is in particular a conventional 85-percent orthophosphoric acid. Likewise, it is also conceivable to use phosphoric acid with a lower concentration. The concentration of the phosphoric acid however amounts to at least 70%, in particular to at least 80%, in particular to at least 85%. The texturing solution in particular consists of pure phosphoric acid. In particular compared to hydrofluoric acid, pure phosphoric acid is relatively harmless to health. Furthermore, the disposal of pure phosphoric acid is much easier than the disposal of an acid mixture. In particular, even a further use of the acid waste, for example as a fertilizer in agriculture, is conceivable as well.

Afterwards, the texturing solution is applied to a semiconductor element with a surface to be structured. To this end, the semiconductor element is in particular immersed in the texturing solution. Alternatively, the texturing solution may be applied to the semiconductor element using a spray-on technique or a spin-on technique.

The texturing solution is then heated to a texturing temperature. A temperature of at least 200° C. causes water to be separated from the orthophosphoric acid such that pyrophosphoric acid is formed. Pyrophosphoric acid is a much stronger acid than orthophosphoric acid. When further heated to a temperature of at least 300° C., even more water is separated from the pyrophosphoric acid, thus initially causing higher polyphosphoric acids to form which then transmute into metaphosphoric acid. This condensation process causes the acid strength to increase. The texturing solution is heated to a texturing temperature of at least 250° C., in particular at least 300° C., in particular to more than 300° C., in particular to at least 310° C., in particular to at least 350° C. In this process, it has been found that a texturing temperature above a minimum temperature causes small gas bubbles to form during the structuring process of the multicrystalline silicon surface. The size of the gas bubbles is important in terms of the texturing quality. The small diameter of the gas bubbles therefore has a positive effect on the texture. What is important is that the texturing solution comprises at least a portion of pyrophosphoric acid and/or metaphosphoric acid.

It is of course conceivable as well to heat up the texturing solution before it is applied to the semiconductor element.

What is claimed is:

1. A method of structuring multicrystalline silicon surfaces, the method comprising the following steps:
    providing a texturing solution;
    applying the texturing solution to a surface of a semiconductor substrate to be structured;
    heating the texturing solution to a texturing temperature,
    wherein the texturing solution comprises at least a portion of phosphoric acid,
    wherein the texturing temperature amounts to at least 200° C., and
    wherein the texturing solution comprises at least a portion of at least one of pyrophosphoric acid and metaphosphoric acid.

2. A method according to claim 1, wherein the texturing solution consists of pure phosphoric acid.

3. A method according to claim 1, wherein the phosphoric acid has a concentration of at least 70%.

4. A method according to claim 1, wherein the phosphoric acid has a concentration of at least 80%.

5. A method according to claim 1, wherein the phosphoric acid has a concentration of at least 85%.

6. A method according to claim 1, wherein the texturing temperature amounts to at least 250° C.

7. A method according to claim 1, wherein the texturing temperature amounts to at least 300° C.

8. A method according to claim 1, wherein the texturing temperature amounts to more than 300° C.

9. A method according to claim 1, wherein the texturing temperature amounts to at least 310° C.

10. A method according to claim 1, wherein the texturing temperature amounts to at least 350°.

* * * * *